United States Patent [19]
Havemann

[11] Patent Number: 6,156,651
[45] Date of Patent: Dec. 5, 2000

[54] METALLIZATION METHOD FOR POROUS DIELECTRICS

[75] Inventor: Robert H. Havemann, Garland, Tex.

[73] Assignee: Texas Instruments Incorporated, Dallas, Tex.

[*] Notice: This patent is subject to a terminal disclaimer.

[21] Appl. No.: 08/988,175

[22] Filed: Dec. 10, 1997

Related U.S. Application Data

[60] Provisional application No. 60/032,976, Dec. 13, 1996.
[51] Int. Cl.[7] ............... H07L 21/44; B44C 1/22
[52] U.S. Cl. ............ 438/674; 438/626; 438/633; 438/675; 438/692
[58] Field of Search ................ 438/633, 626, 438/674, 675, 692

[56] References Cited

U.S. PATENT DOCUMENTS

| | | | |
|---|---|---|---|
| 5,116,463 | 5/1992 | Lin et al. | 156/643 |
| 5,891,804 | 4/1999 | Havemann et al. | 438/674 |

OTHER PUBLICATIONS

U.S. application No. 60/047,793, List et al., filed May 28, 1997.
Barrier Metal Free Copper Damascene Interconnection Technology Using Atmospheric Copper Reflow and Nitrogen Doping in SiOF Film, K. Mikagi, et al, USLI Development Laboratories, NEC Corporation, Japan.

*Primary Examiner*—Charles Bowers
*Assistant Examiner*—Lisa Kilday
*Attorney, Agent, or Firm*—Frederick J. Telecky, Jr.; Rebecca Mapstone Lake

[57] ABSTRACT

This is a method of forming mechanically robust vias and entrenched conductors on a dielectric layer (which dielectric layer is on an electronic microcircuit substrate which vias and entrenched conductors are electrically connected to a conductive area on the surface of the substrate) and a structure formed thereby. Generally some of the dielectric layers added above the microcircuit comprise a porous dielectric having a desirable low dielectric constant but low mechanical robustness. Special methods are described which generally comprise: forming the dielectric layer over the substrate; forming a nanaporous dielectric layer over the substrate; depositing a planarizing stopping material over the top surface of said nanaporous dielectric; depositing and patterning photoresist; etching said stopping material and nanaporous dielectric layer in a conductor pattern to expose at least a portion of said conductive area on the surface of said substrate; depositing a wall seal; depositing conductor metal; and planarizing said structure. Generally the via metal and the conductor metal consist essentially of aluminum, copper or combinations thereof. The conductor metal may be doped with the selectively deposited via metal being doped by dopant diffusion from the conductor metal, thereby avoiding the difficulty of depositing a doped selective metal. Methods are shown for realizing desirable insulating and conducting layers without deleterious mechanical effects.

100 Claims, 15 Drawing Sheets

METALLIZATION METHOD FOR POROUS DIELECTRICS

This application claims priority under 35 USC § 119 (e)(1) of provisional application No. 60/032,976, filed Dec. 13, 1996.

CROSS REFERENCE TO RELATED APPLICATIONS

A method of providing metallization above a semiconductor substrate is described in related applications Ser. No. 60/016,054 (Docket TI-23228) and Ser. No. 06/015,843 (Docket TI-22445) assigned to the same assignee and co-filed.

FIELD OF THE INVENTION

This invention relates to microcircuits and in particular to methods of providing metallization above a semiconductor substrate.

BACKGROUND OF THE INVENTION

In the semiconductor industry the fabrication of microelectronic circuits typically uses substrates comprised of single-crystal silicon or insulation and interconnects (including vias) on single-crystal silicon and typically requires that several thin films of both insulating and conducting materials be formed and patterned sequentially on the silicon surface. The conventional wiring above a semiconductor substrate utilizes aluminum conductors with a small amount of copper, however, some microcircuits have been proposed using copper conductors. Copper wiring and electroless copper deposition are, of course, known for printed circuit boards.

Generally, the insulating films are a dense silicon dioxide dielectric, both horizontally between the conductors (intralevel dielectric) and vertically between layers of conductors (interlevel dielectric). Metal filled vias are used, e.g., to provide electrical connections between conductors in different levels. Such metal filling has generally been provided by physical vapor deposition (PVD), e.g. sputtering or vacuum deposition.

SUMMARY OF THE INVENTION

This invention utilizes conductors imbedded in trenches of porous dielectrics for use with semiconductor integrated circuits. Such a process is analogous to the ancient art of Damascus for decorating iron by entrenching rare metals in chiseled grooves and is hereafter referred to as a Damascene process. In Damascene processes it is desirable to use chemical mechanical polishing (CMP) for the preferential removal of certain materials while leaving others.

CMP of Damascene metals embedded in porous dielectrics requires special processes. Porous dielectrics tend to have lower mechanical strength than standard oxide dielectrics and are also more prone to moisture absorption. This invention describes methods of overcoming these obstacles. One method shows the use of a graded density in the porous dielectric with higher density towards the surface. Another embodiment provides a more rigid dielectric layer as a stopping layer for the CMP. Alteratively, a metal stopping layer having sufficient specificity between the metal being polished and this stopping layer during CMP can be used. The CMP stopping layer may also be deposited into the Damascene trench to provide a moisture and/or diffusion barrier. Other novel mechanical reinforcement methods are claimed.

The method can generally comprise: forming a nanaporous dielectric layer over the substrate; depositing a planarizing stopping material over the top surface of said nanaporous dielectric; depositing and patterning photoresist; etching said stopping material and nanaporous dielectric layer in a conductor pattern to expose at least a portion of said conductive area on the surface of said substrate; depositing a wall seal; depositing conductor metal; and planarizing said structure.

The method of depositing a wall seal may comprise: isotropically depositing a dielectric over the planarizing stopping material and nanaporous dielectric layer; and anisotropically patterning and etching the dielectric to remove said dielectric from said planarizing material and the conductive area on the surface of the substrate.

Another embodiment may disclose a wall seal of depositing a conductive material over the planarizing stopping material and nanaporous dielectric layer.

The conductor deposition may be by blanket metal deposited by sputtering, e.g. by metal ion-assisted or high-density plasma (HDP) sputtering at a temperature of 300–600 degrees C., and the sputtering may be followed by metal reflow at a temperature of 300–600 degrees C. or extrusion at a pressure of 500–4000 psi.

The seed layer (selective deposition initiator) may be selected from the group consisting of tungsten, titanium, palladium, platinum, copper, aluminum, and combinations thereof.

The conductor metal may be doped with the selectively deposited via metal, being doped by dopant diffusion from the conductor metal, thereby avoiding the difficulty of depositing a doped selective metal.

BRIEF DESCRIPTION OF THE DRAWINGS

This invention can be best understood by reference to the following drawings in which.

DESCRIPTION OF THE PREFERRED EMBODIMENTS

Figure 1A:
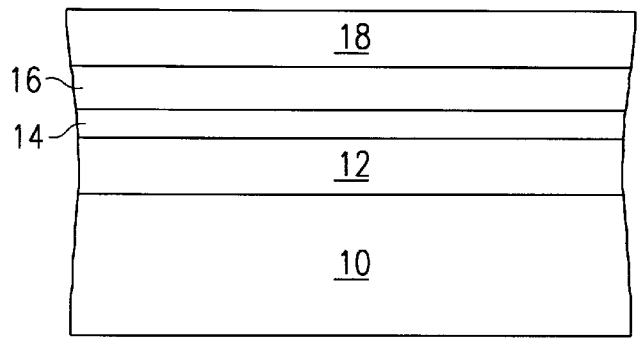
FIGS. 1A–1K show the steps in producing a microcircuit conductors and the product produced thereby, using conductor encapsulation, as might be used, e.g., with copper conductors.

This invention provides a method and structure for conductors and/or vias on a microcircuit substrate which include a nanaporous dielectric layer.

The conductors and vias of this invention will generally be either copper, tungsten or aluminum or combinations thereof. Copper generally presents difficulties in dry etching, and one approach to copper has been to use a Damascene type process in which a via or trench has been filled (e.g., by vacuum deposition of the metal or sputtering) which fills the hole and coats the top surface of the surrounding insulators, followed by removal of the material which is on top of the insulators, for example by chemical mechanical polishing (CMP). The process in several embodiments is shown with encapsulation as would generally be used with copper, but with aluminum, while conductor sidewalls are still preferred, complete encapsulation will typically not be used. Although a dense interlevel dielectric can be used, a low density "aerogel" type dielectric is used in some examples herein. The deposition of low density aerogel is described in co-pending application Texas Instruments S.N. TI-22782, filed Mar. 25, 1996, entitled "Polyol-based Method for Forming Thin-Film Aerogel on Semiconductor Substrates", assigned to Texas Instruments, Inc.

FIG. 1A–1K show a Damascene type process for conductors which could be used with copper metallization, (encapsulation is preferred with copper filled vias and copper conductors and a Damascene process is preferred for copper conductors). The substrate 10 generally contains microelectronic components, and may, as used herein, contain conductors and dielectrics over a silicon substrate. A low density aerogel 12 (e.g., one micron thick layer of 30% theoretical density aerogel) is used as the intralayer dielectric. The aerogel is then aged (e.g., for one minute at 140° C.). This embodiment uses a high density intralayer of aerogel 14 e.g., 0.1 micron at 85–90% density) then applied over the low density aerogel and aged, and both aerogel layers are dried. A physical vapor deposition sacrificial layer 16 (e.g., 0.05 microns of silicon nitride) is applied over the aerogel and a photoresist 18 is applied over the sacrificial layer to give the structure of FIG. 1A.

Figure 1B:
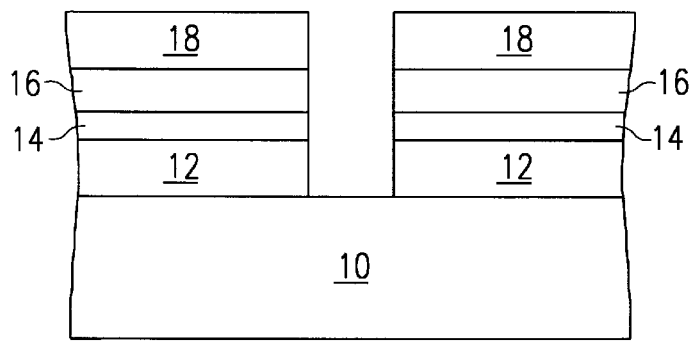
Figure 1C:
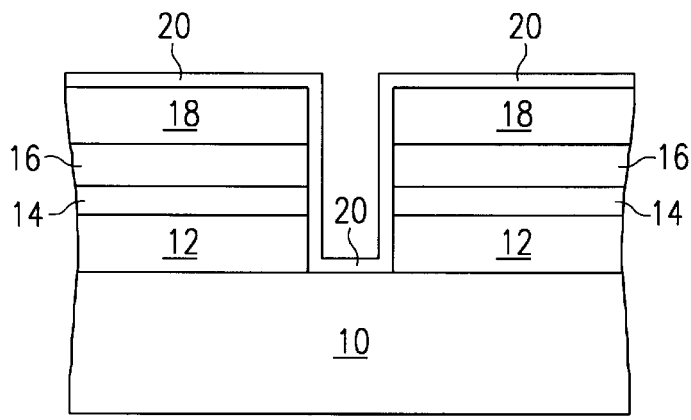
Figure 1D:
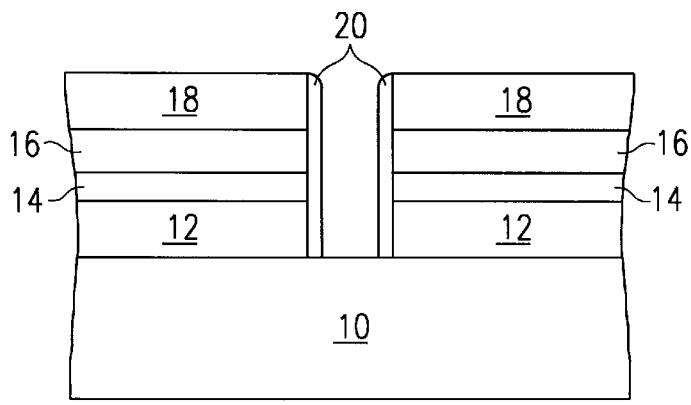
Figure 1E:
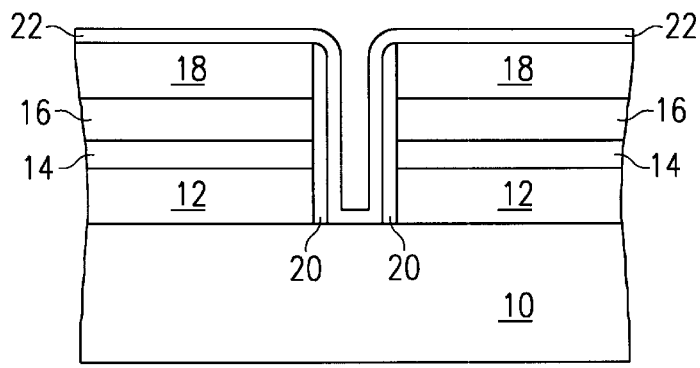

FIG. 1B shows the structure after the photoresist has been patterned and the underlying layers etched down to the substrate 10. FIG. 1C shows the structure after a dielectric seal layer 20 (e.g., 0.01 micron of paralene) has been deposited. FIG. 1D shows the structure after an isotropic etch back has removed the dielectric seal layer material 20 from the horizontal surfaces to provide a vertical sidewall type dielectric seal 20. FIG. 1E shows the chemical vapor deposited titanium nitride encapsulation layer 22, which is deposited to a thickness of, for example, 0.01 micron.

Figure 1F:
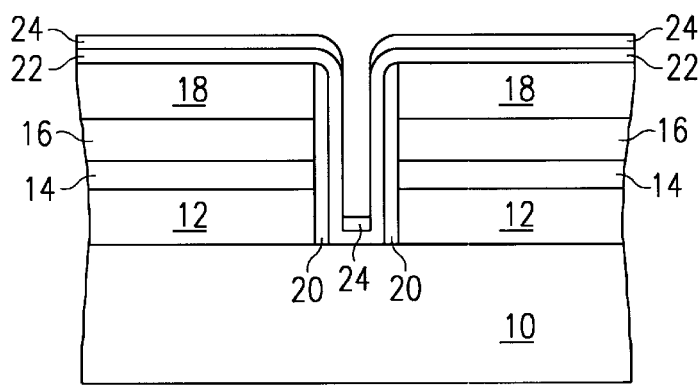
Figure 1G:
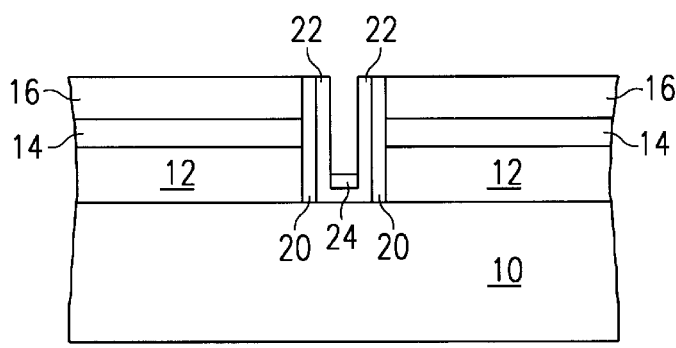
Figure 1H:
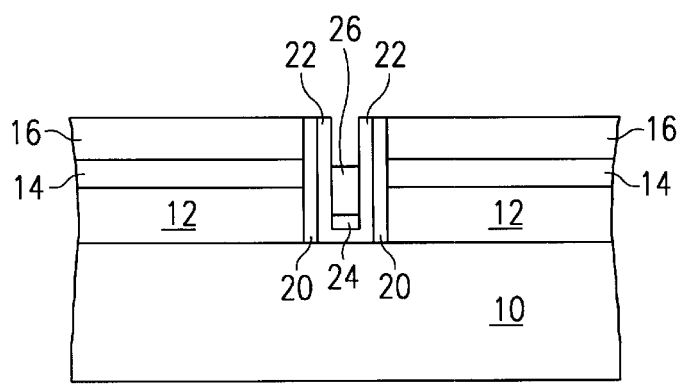

FIG. 1F shows an isotropically deposited selective deposition initiator 24 (e.g., vacuum deposited or sputtered palladium or platinum). The photoresist layer 18 is then stripped to remove all layers above it by a lift-off process, leaving the structure as shown in FIG. 1G with 24 left at the bottom of the trench. The conductor material 26 is then selectively deposited on the initiator 24 (e.g., copper by the "electrolysis" copper deposition process from liquid precursor as known in the art (to partially fill the groove, preferably to above the bottom of the high density aerogel layer 14, but below the bottom of the sacrificial layer 16 to produce the structure of FIG. 1H. It will be noted that, under some conditions, the selective deposition will also occur, but at a much lower rate, on the titanium nitride encapsulation 22. Silicon nitride could be used as the encapsulating material to give even greater selectivity, but would need to be selectively removed (e.g. from any bottom portion where the conductor is to make electrical contact to via metal).

Figure 1I:
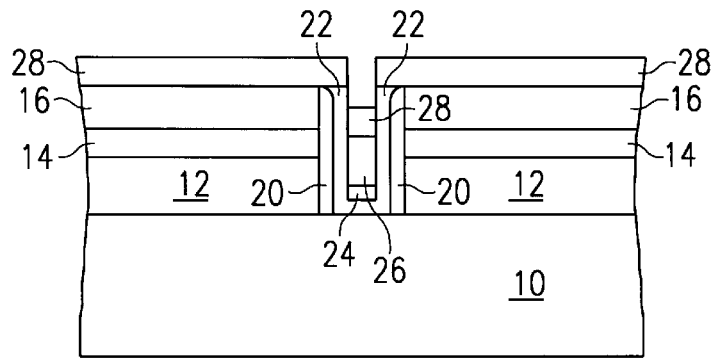
Figure 1J:
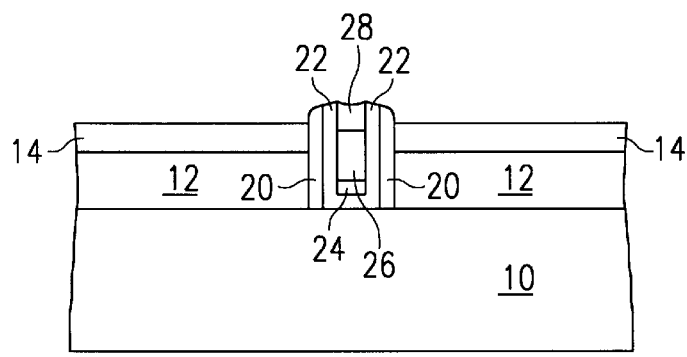
Figure 1K:
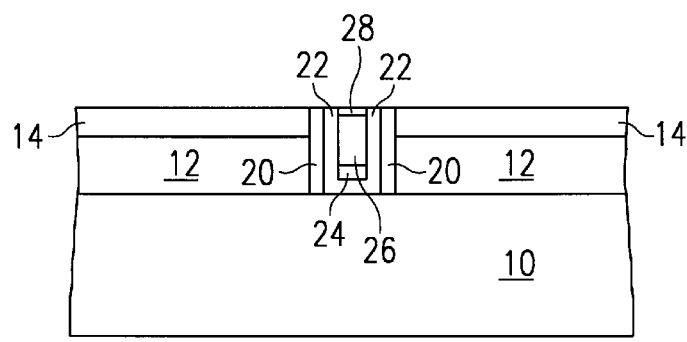

FIG. 1I shows top conductor encapsulation 28 (e.g., physical vapor deposited titanium nitride with a thickness of about 0.01 micron) deposited on horizontal surfaces and covering the top of conductor 26 to above the bottom of sacrificial layer 16. The sacrificial layer 16 is then stripped to reject the portion of the top conductor encapsulation 28 which is above the sacrificial layer 16. This provides the configuration of FIG. 1J. Chemical mechanical polishing (CMP) can then be used to planarize the structure to produce the configuration of FIG. 1K.

Figure 2A:
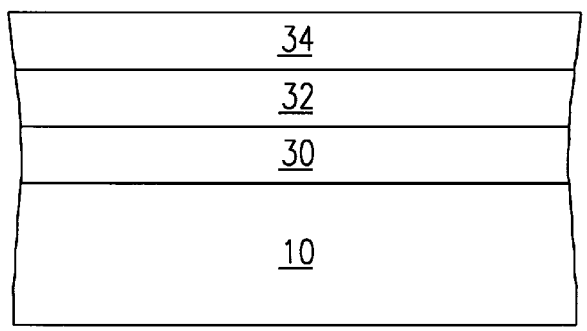
FIGS. 2A–2E show the steps in producing a microcircuit vias and the product produced thereby, using via encapsulation, as might be used, e.g., with copper filled vias.
Figure 2B:
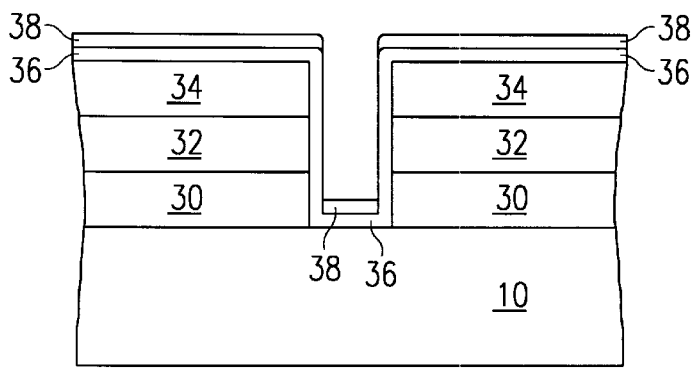
Figure 2C:
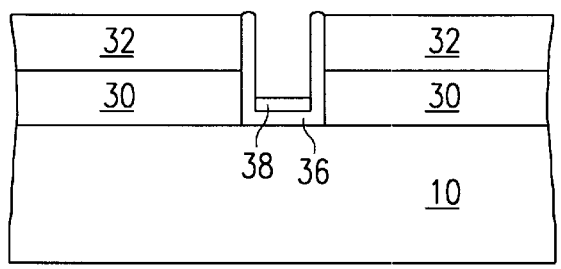
Figure 2D:
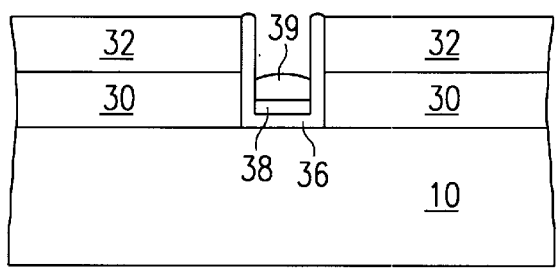
Figure 2E:
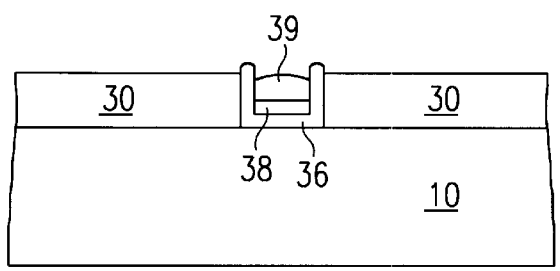

FIGS. 2A through 2E show an encapsulation type process for vias (again as might be used with copper metallization). FIG. 2A shows an enter level dielectric layer 30 (e.g., spin on glass or high density aerogel) on top of a substrate 10 (again substrate 10 contains micro electronic circuit components and can contain lower levels of conductors and dielectrics. Sacrificial layer 32 (e.g., silicon nitride) is over the enter level dielectric layer 30, and photoresist layer 34 is over the sacrificial layer 32. FIG. 2B shows the structure after patterning of the photoresist and etching of the sacrificial layer 32 and the interlevel dielectric 30. A via encapsulation 36 (e.g., chemical vapor deposited titanium nitride) has been deposited, and a via selective deposition initiator 36 has been added by physical vapor deposition (e.g., vacuum deposited palladium or platinum) to produce the configuration of FIG. 2B. Stripping of the photoresist 34 removes the top portion of the encapsulation material 36 and the via selective deposition initiator 38 to produce the structure of FIG. 2C. Via metal 39 is deposited on the via selective deposition initiator 38 to produce the structure of 2D. The sacrificial layer is then stripped to produce the structure of FIG. 2E removing any of the via metal which may have been inadvertently deposited on top of sacrificial layer 32. Note that the structure can be planarized by chemical mechanical polishing at this time without touching the via metal 39, and thus problems with via metal 39 being physically moved ("smeared") and deposited on top of the intralevel dielectric 30 is eliminated.

Figure 3A:
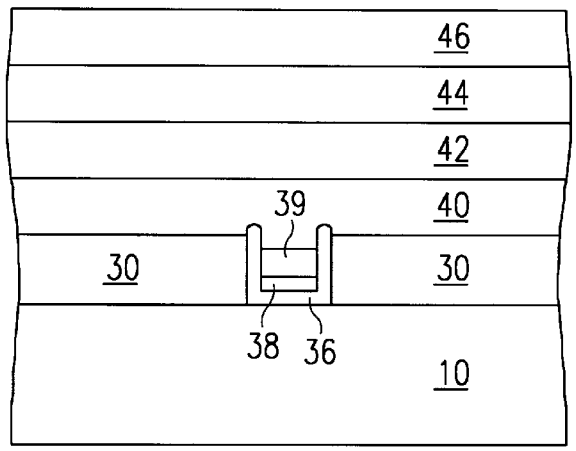
FIGS. 3A–3G show a process for creating a combined via and conductor by a damascene technique and the structure produced thereby, using via and conductor encapsulation, as might be used, e.g., with copper filled vias and conductors.
Figure 3B:
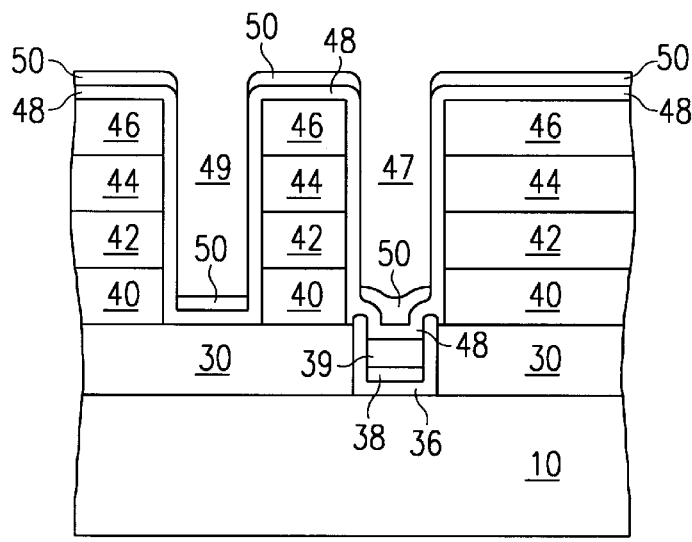
Figure 3C:
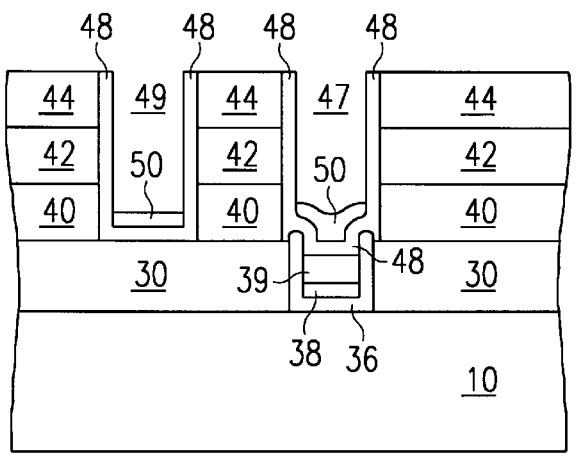
Figure 3D:
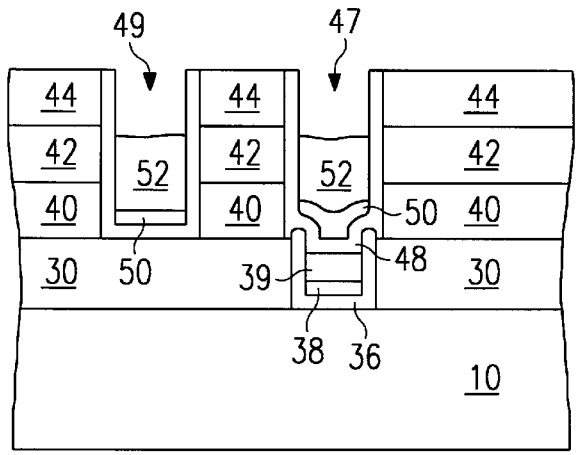
Figure 3E:
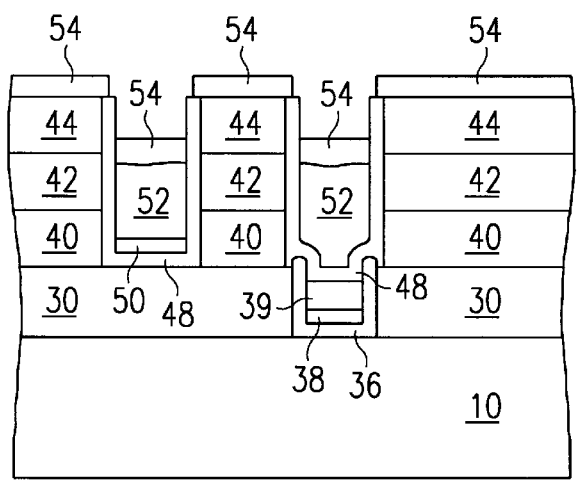
Figure 3F:
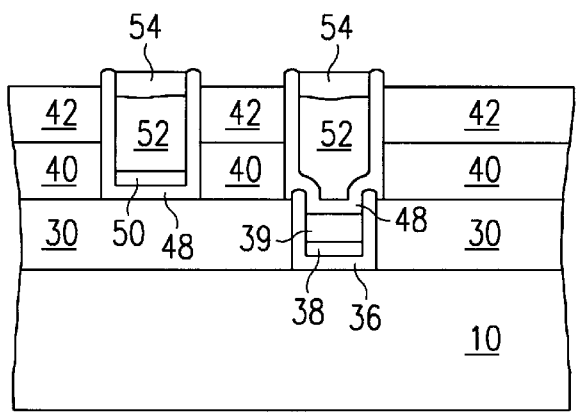
Figure 3G:
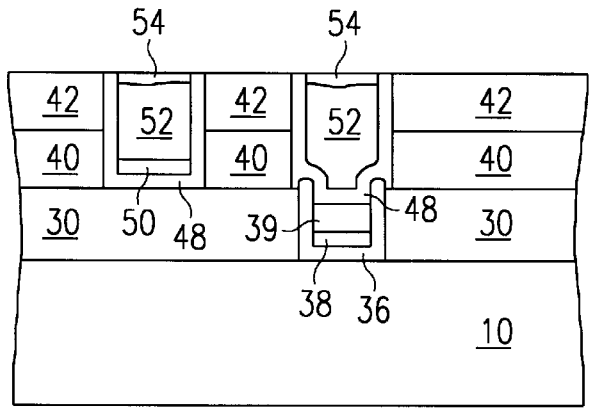
Figure 4A:
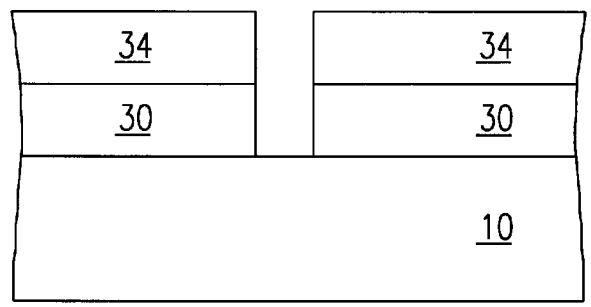
FIGS. 4A–4E show the steps in producing a microcircuit vias and the product produced thereby, without using via encapsulation, as might be used, e.g., with aluminum filled vias.
Figure 4B:
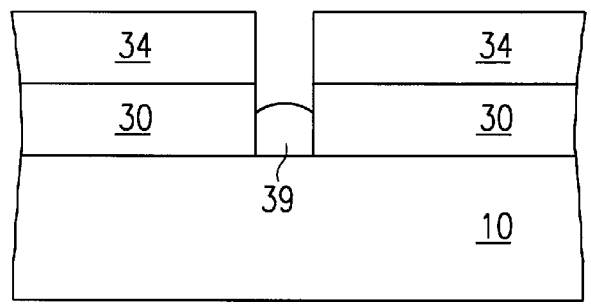
Figure 4C:
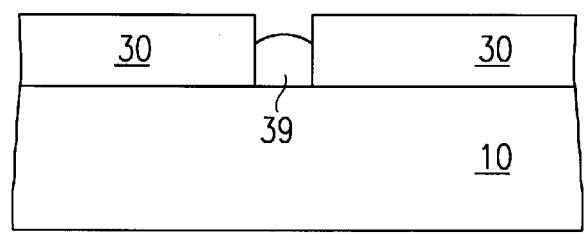
Figure 4D:
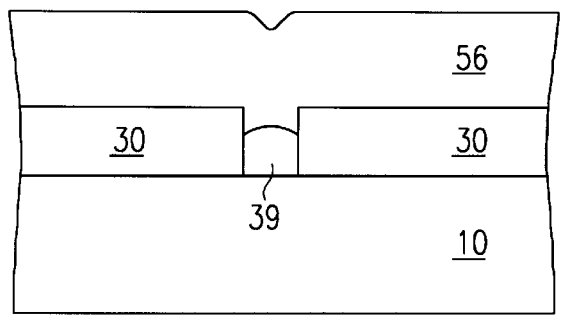
Figure 4E:
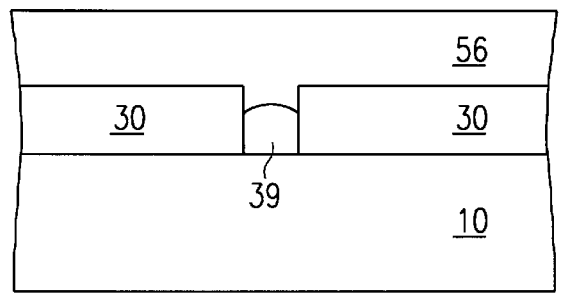

FIGS. 3A–3G show an encapsulation type process for vias and conductors (again as might be used with copper metallization). FIG. 3A shows additional layers deposited on the top of the configuration of FIG. 2E. A low density aerogel layer 40, a high density aerogel 42, a sacrificial layer 44 and a photoresist layer 46 have been deposited in a manner generally as described for layers 12, 14, 16, and 18 as described with regard to FIG. 1A. A conductor groove 47 has been shown open down to the via and a second conductor groove 49 has been opened down to the innerlayer dielectric 30 (but not over a via). Encapsulation layer 48 (e.g., 0.10 micron of silicon nitride) has been isotropically deposited (e.g., by chemical vapor composition). Selective deposition initiator 50 has been isotropically deposited (e.g., 0.01 microns of palladium, platinum or copper) to produce the structure of FIG. 3B. FIG. 3C shows the structure after the photoresist 46 has been stripped to lift off the portions of the encapsulating layer 48, and in particular the selective deposition initiator 50 which were above the photoresist 46. FIG. 3D shows conductor metal 52 deposited in conductor grooves 47 and 49. Preferably the conductor 52 is deposited at least in part by selective electroless deposition. The conductor metal 52 in conductor groove 47 extends down to and makes electrical contact with the via metal 39 (here through selective deposition initiator 50). Preferably the conductor metal 52 deposited initially by electroless deposition and then by physical deposition and preferably the conductor metal 52 fills the conductor grooves 47 and 49 to just below the bottom level of the sacrificial layer 44 to give the configuration shown in FIG. 3D. FIG. 3E shows a top encapsulation 54 deposited by physical vapor deposition (e.g., 0.01 micron of titanium nitride). FIG. 3F shows the structure after stripping of the sacrificial layer 44 to liftoff any conductor metal which inadvertently deposited during selective deposition of conductor metal 52, as well as conductor metal deposited on top of the sacrificial layer 44 by physical vapor deposition, if used, and also excess top encapsulation material again which deposited on top of sacrificial layer 44. Note also that if selective deposition or were used to completely deposit the conductor metal 52 that the sacrificial layer prevents mushrooming from any conductors that were over fill. FIG. 3G shows the structure after an optional chemical mechanical polishing has been used to planarize the surface. Planarization is preferred as the very fine geometries have a very small depth of field for lithography. Note also that the utilization of a relatively thick top encapsulation 44 provides tolerances for variation in depth of filling of conductor metal, such that all conductors preferably have at least a thin layer of top encapsulation 54 and that planarization has exposed the top of encapsulation 54 for all conductors.

FIGS. 4 show a process for a via conductor combination using vias filled to less than the height of an interlevel dielectric. FIG. 4A shows a substrate 10 with an intralevel dielectric 30 and photoresist 34 after the photoresist has been lithographically exposed, developed and he intralevel dielectric 30 has been etched to provide a via opening. FIG. 4B shows the structure after via metal 39 has been selectively deposited. Although photoresist 20 is shown here as remaining through selective deposition, the photoresist could be removed prior to selective deposition. In another embodiment, also not shown, a sacrificial layer (e.g. silicon nitride) is deposited between the photoresist and the dielectric and the photoresist is removed prior to selective deposition. Leaving the sacrificial layer exposed (generally giving the structure of FIG. 4B, but with a more robust sacrificial layer in place of the photoresist). The selective deposition fills the via to less than the height of the inner level dielectric 30. While the selective deposition can be stopped prior to the via metal reaching the top of the intralevel dielectric 30, the selective deposition could also be continued to over the top of the intralevel dielectric 30 and then an etch back process used to reduce the metal level back to below the top of the dielectric 30. FIG. 4C shows the structure after stripping of the photoresist or sacrificial layer. Again, stripping the photoresist or sacrificial layer removes any via metal which inadvertently was deposited on top of said layer. FIG. 4D shows the structure after a deposition of the conductor metallization 56. This deposition can be, for example, by vacuum deposited or sputtering, for example, aluminum. While the structure of FIG. 4D can generally be used without planarization, in some cases, planarization may be desirable. FIG. 4E shows the structure after planarization. Preferably the planarization is by chemical electromechanical polishing, but can be performed by spinning on a planarizing material such as photoresist then etching back the photoresist to remove the top portion of the conductor metal 56 and provide planarization.

Figure 5A:
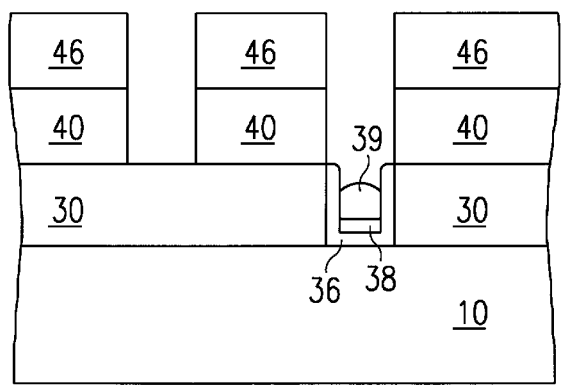
FIGS. 5A–5G show a combination via and conductor process which provides conductors with insulating the sidewall encapsulation and conducting a top and bottom encapsulation.
Figure 5B:
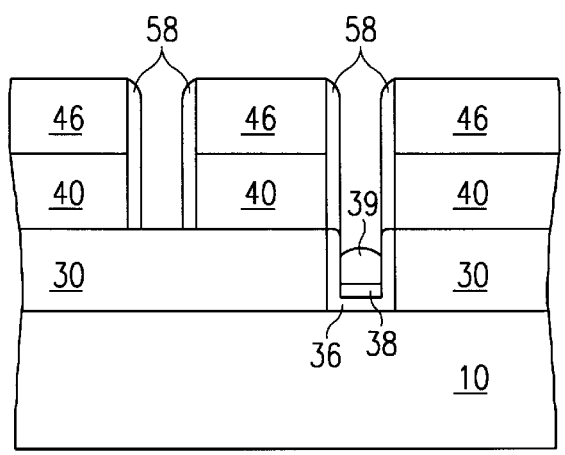
Figure 5C:
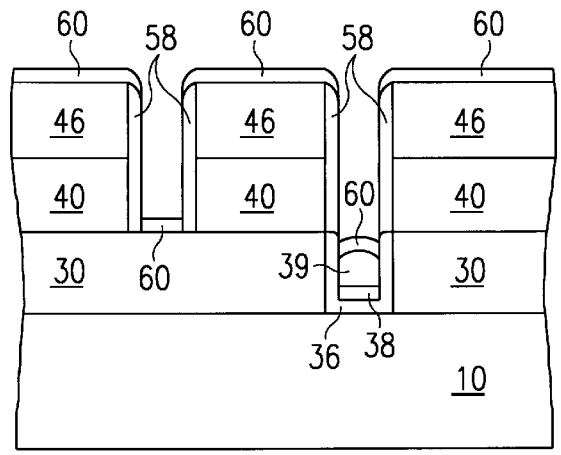
Figure 5D:
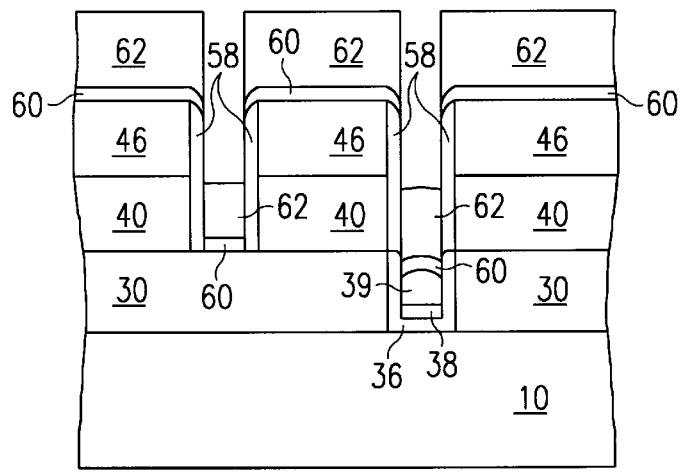
Figure 5E:
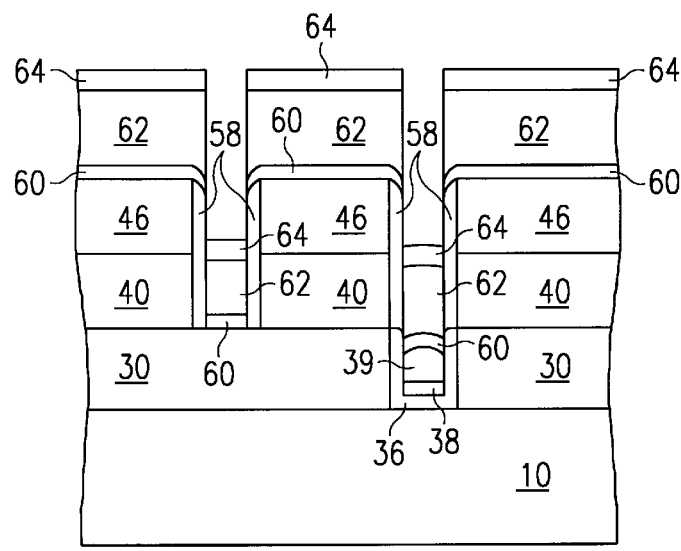
Figure 5F:
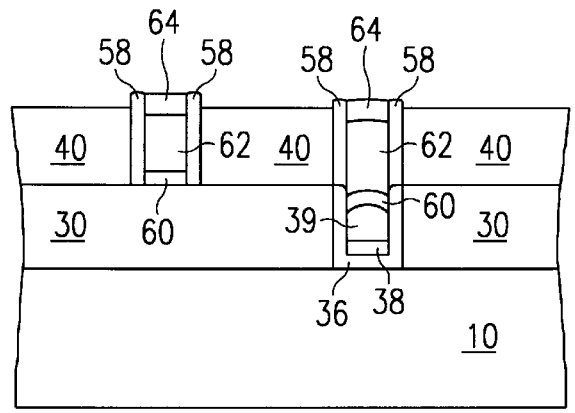
Figure 5G:
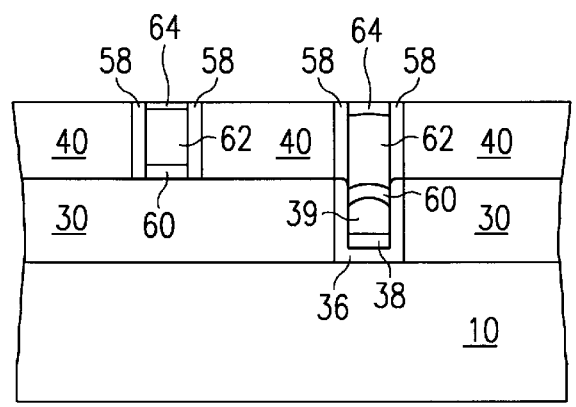

FIGS. 5A–5G show a combination via and conductor process which provides conductors with insulating sidewall encapsulation and conducting top and bottom encapsulation. FIG. 5A shows a substrate 10 with a dielectric 30 and a via liner 36 (e.g., of titanium nitride) a via selective deposition initiator 38 and via metal 39 (generally the configuration of FIG. 2E). A low density nanoporous dielectric 40 and a photoresist layer 46 have been deposited (again over the configuration of FIG. 2E and the photoresist lithographically exposed and developed and the nanaporous dielectric 40 etched to provide two openings, one down to the interlevel dielectric 30 and the second down to expose the via metal 39. In FIG. 5B, an insulating conductor encapsulating material has been isotropically deposited and then anisotropically etched to provide a sidewall configuration, each of silicon nitride 58. FIG. 5C shows the structure after an isotropic deposition of conductive conductor bottom encapsulation 60 (e.g., titanium nitride). FIG. 5D shows conductor metal 62 (e.g., copper vacuum deposited or sputtered). FIG. 5E shows the structure after the deposition of a conductor top encapsulation 64 (e.g., 0.05–0.2 microns of an isotropically titanium nitride). Notice that the top encapsulation is preferably relatively thick to allow for planarization. FIG. 5F shows the structure after stripping the photoresist, to lift off top portions of the conductive conductor bottom and encapsulation 60, the conductor metal 62 and the conductor encapsulation 64. FIG. 5G shows the structure after planarization. Again, the planarization may be by chemical mechanical polishing.

Figure 6A:
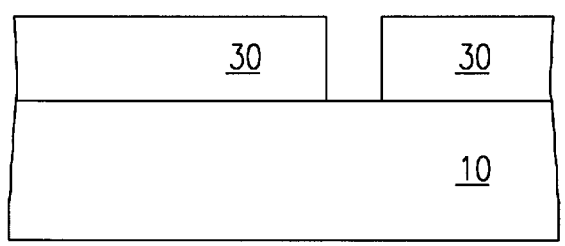
FIGS. 6A–6F show an embodiment wherein the vias are opened and the conductor grooves are patterned and then selective metal (e.g., aluminum) is used to partially fill the via and then the conductor metal is deposited.
Figure 6B:
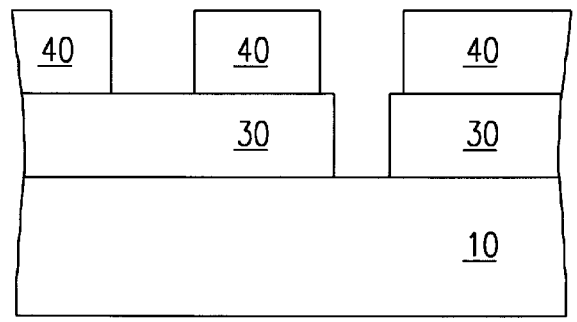
Figure 6C:
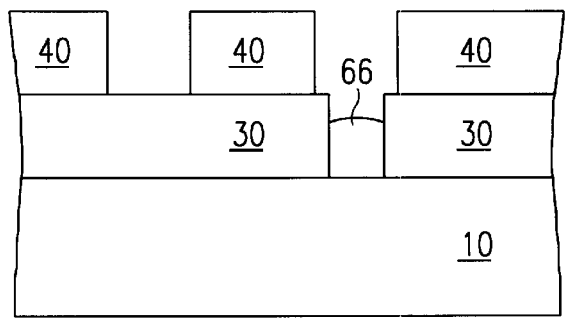
Figure 6D:
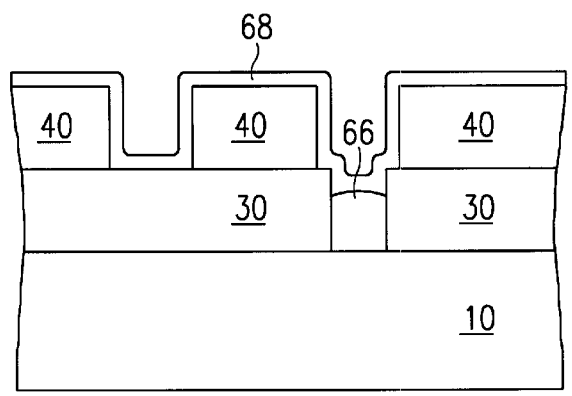
Figure 6E:
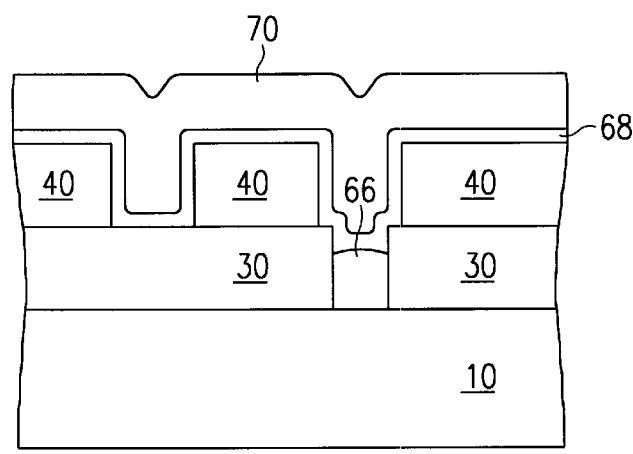
Figure 6F:
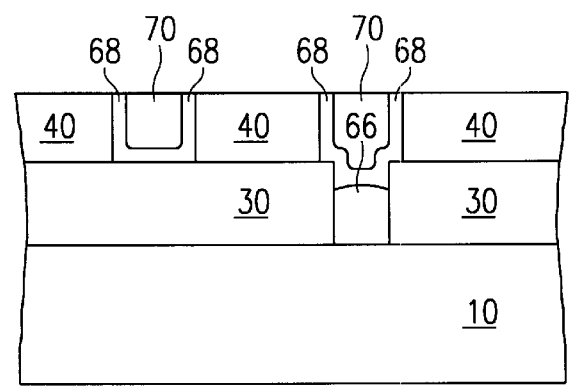

FIG. 6A shows a substrate 10 with a via opening through interlayer dielectric 30 (e.g., silicon dioxide applied as a spin-on glass). FIG. 2B shows a nanaporous silica dielectric layer 40 patterned with conductor grooves. FIG. 6C shows the structure after deposition of selective metal (e.g., aluminum) here with the selective metal deposition initiated by a conductive area in the substrate at the bottom of the via. In FIG. 6E conductor metal 70 has been deposited over the entire area, including filling the conductor grooves (e.g., PVD or CVD aluminum). FIG. 6F shows the structure after planarization, where the excess conductor metal 70 has been removed and the planarization has also removed the portions of cut formal conductor liner 68 which were on top of the nanoporous dielectric 40. An advantage of this method is that the patterning is completed prior to the deposition of via and conductor metals and thus, for example, the deposition of the via metal the conductor liner, and the conductors can be done sequentially in the same chamber.

Figure 7A:
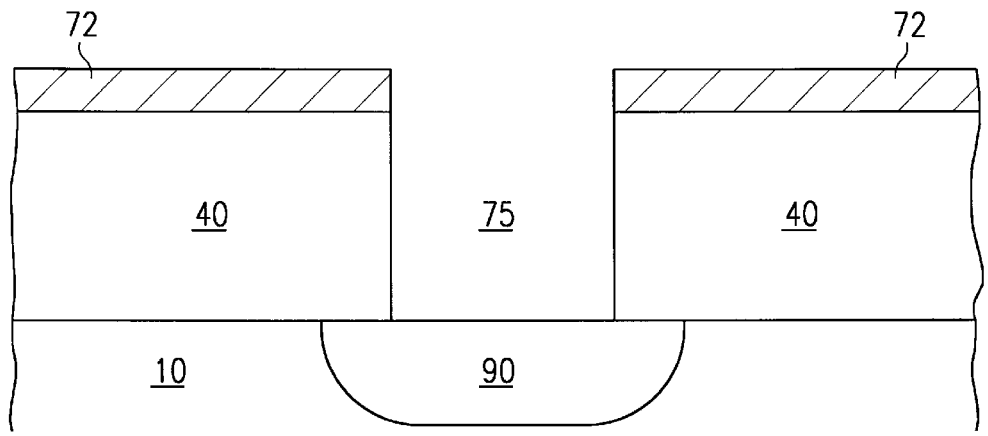
FIGS. 7A shows a CMP stopping layer deposited on the nanaporous dielectric and then a Damascene trench having been etched out of the nanaporous dielectric.
Figure 7B:
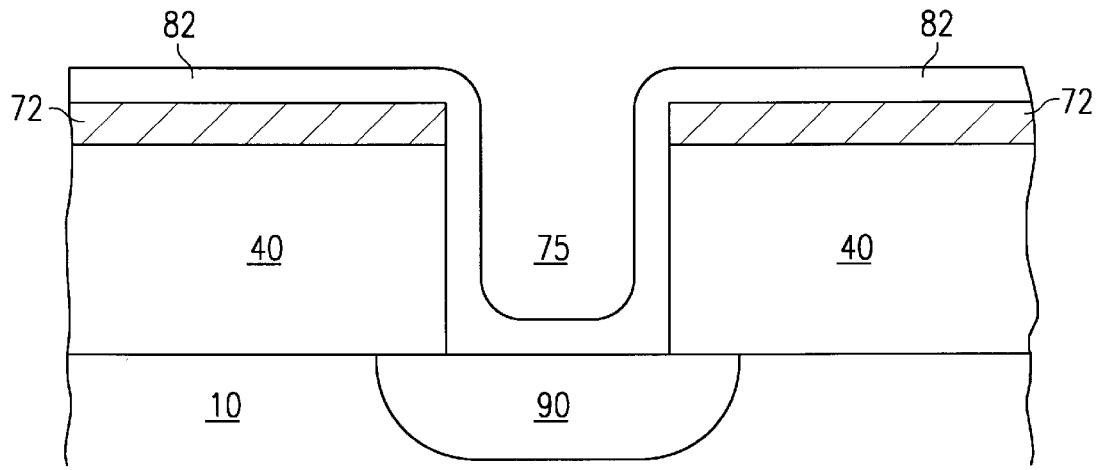
FIGS. 7B–7E is a further progression of FIG. 7A which shows an insulative CMP stopping layer structure after sidewall deposition, conductor metal deposition and CMP.
Figure 7C:
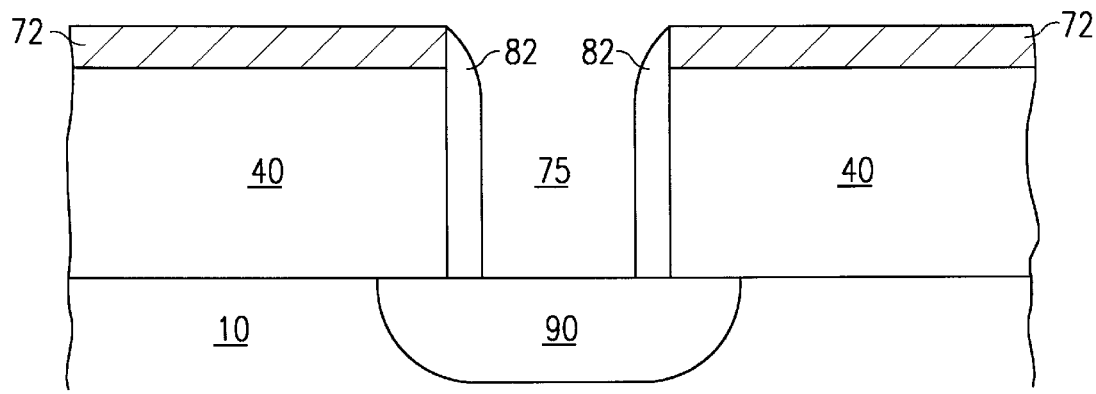
Figure 7D:
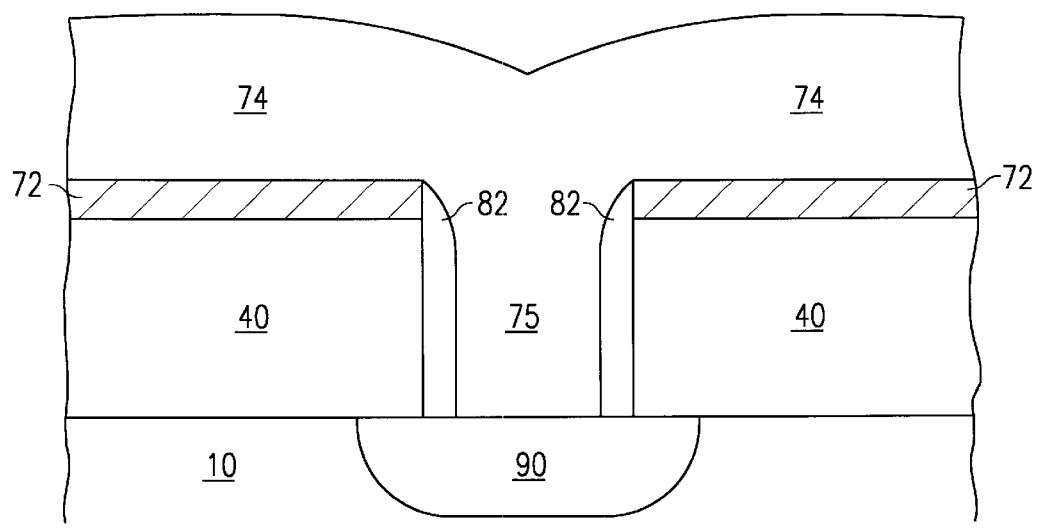
Figure 7E:
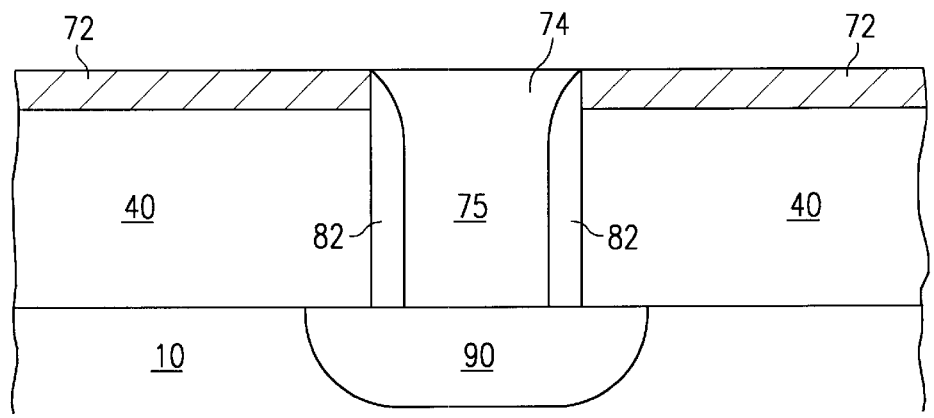
Figure 7F:
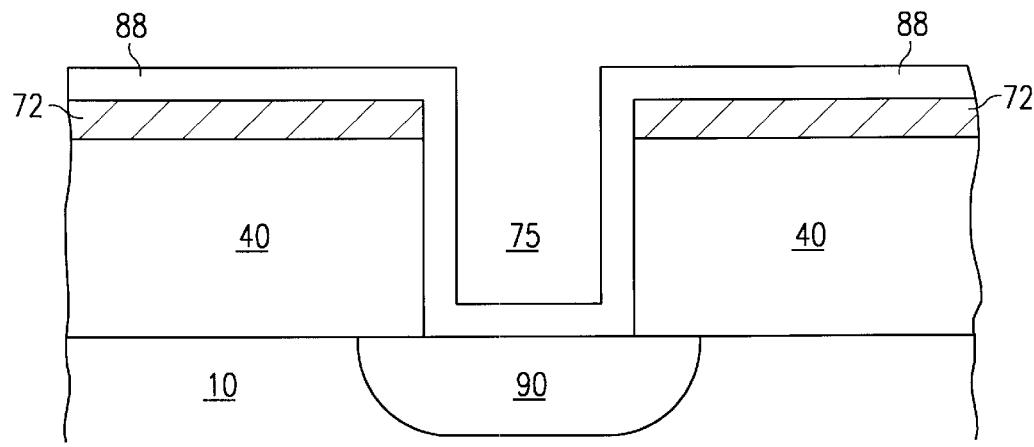
FIGS. 7F–7H is also a further progression of FIG. 7A which shows instead a conductive CMP stopping layer structure after deposition of the conductive wall seal and the conductor metal and then CMP.
Figure 7G:
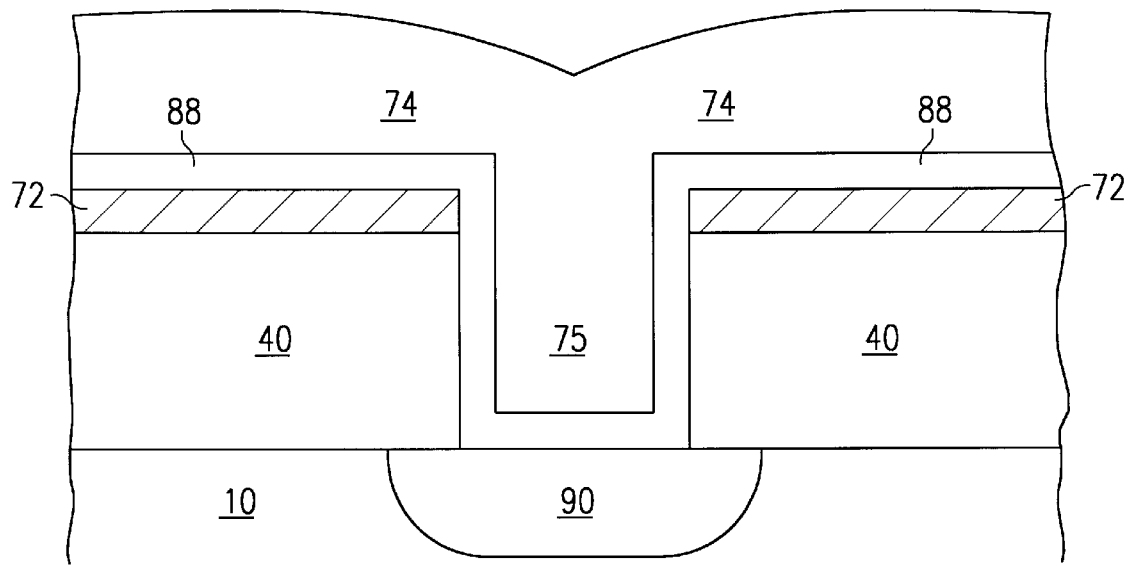
Figure 7H:
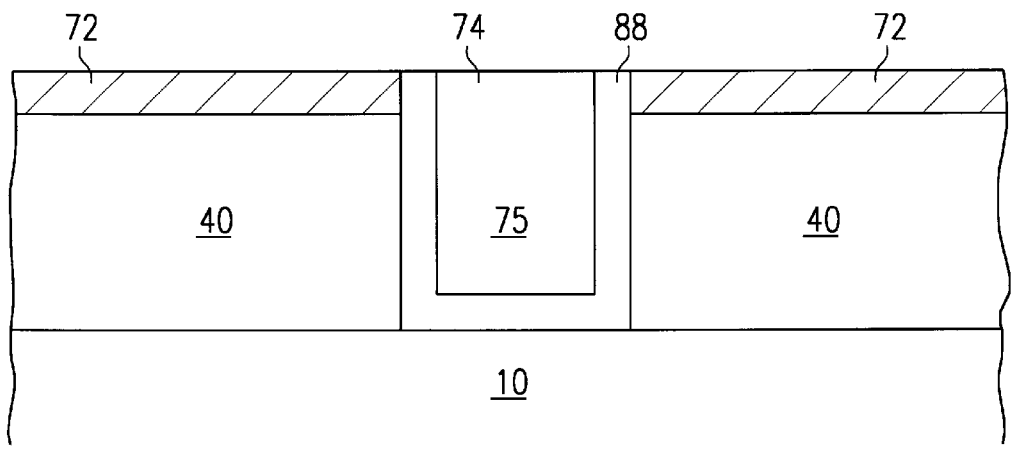

FIG. 7A shows substrate 10 covered with a nanoporous dielectric layer 40 over which CMP stopping layer 72 has been deposited and then in which trench 75 has been etched. This material 72 may be insulating or conducting and provides additional protection for the nanoporous dielectric 40 against mechanical damage during CMP and moisture absorbtion. Because the finished structure, beyond the structure shown in FIG. 7A which shows those process steps which are the same for either an insulative or conductive CMP stopping layer, requires different seal steps if the CMP stopping material is either an insulator or a conductor, FIGS. 7B–7E show the further processing steps if the CMP stopping layer is an insulator, i.e. SiO2, or as plasma enhanced tetraethyl oxysilicate (PETEOS), and FIGS. 7F–7H show the further processing steps if the CMP stopping layer is conductive. FIG. 7B shows FIG. 7A after deposition of the sidewall insulation layer(82), i.e. SiO$_2$, wherein trench 75 and the top surface of the CMP stopping layer 72 are then covered with a layer of insulation(82). FIG. 7C shows FIG. 7B after the sidewall insulation layer(82) has been etched, thereby removing the insulating material(82) from the top of the CMP stopping layer(72) and the bottom of trench 75 and leaving insulation(82) along the nanaporous structure's(40) sidewall. FIG. 7D shows FIG. 7C after conductor metal deposition, thereby covering the nanaporous(40) and CMP stopping(72) layer and filling in trench 75, making conductive connection with a conductive area(90) on the surface of the substrate(10). Substrate (10) could comprise single-crystal silicon or insulation and interconnects (including vias) on single crystal silicon. FIG. 7E shows a view of the Damascene metal 74 in trench 75 after CMP. As shown, planarizing stopping material 72 has acted as a stop for the CMP in both FIGS. 7E(insulative planarizing stopping layer) and 7H(conductive planarizing stopping layer), although no harm results if 72 is partially removed. The Damascene metal 74 such as copper, aluminum or alloys is broadcast deposited by means such as sputtering, vacuum evaporation or electrodeposition over the entire surface.

Figure 8:
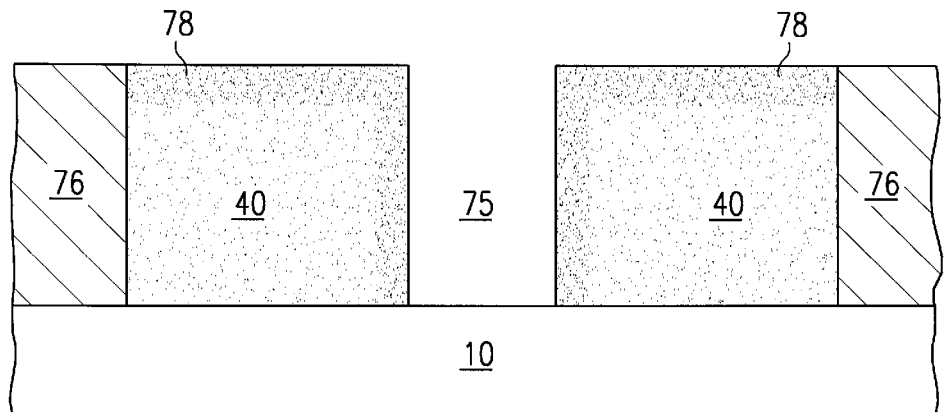
FIG. 8 shows an embodiment of treatments of the mechanically weak porous dielectric in order to enhance the survival of said porous dielectric during subsequent handling including CMP.

In FIG. 8 are shown other means for improving mechanical robustness of structures evolving nanoporous dielectric layer 40. Prior to the deposition of the conducting layer 72 and after the Damascene trench 75 has been etched, the surface and trench of 40 may be treated to produce a higher density dielectric as indicated by 78. In addition, distributed plugs 76 of high strength dielectric material such as PETEOS as well as an annular ring of such material can be used to provide further protection during handling and CMP.

Figure 9A:
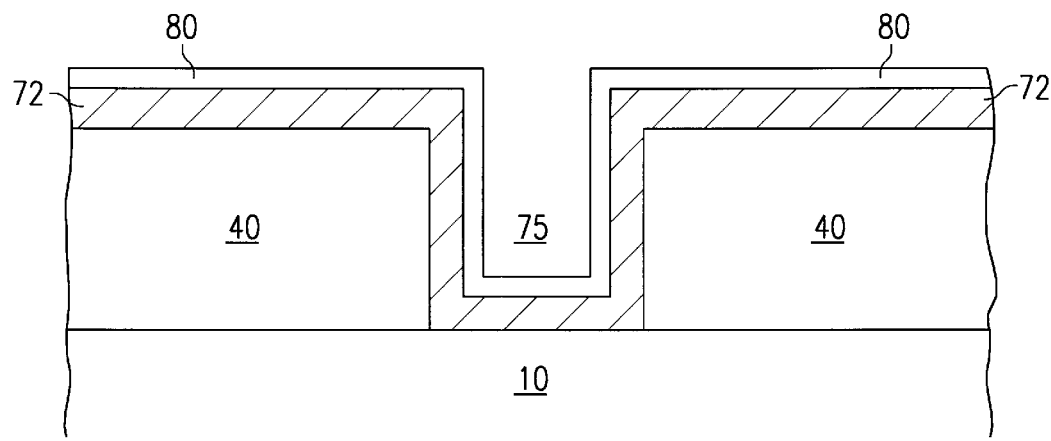
FIGS. 9A–B shows an embodiment of a two layer CMP inhibitor and moisture barrier said layers consisting of a metal over an insulator in a Damascene trench.
Figure 9B:
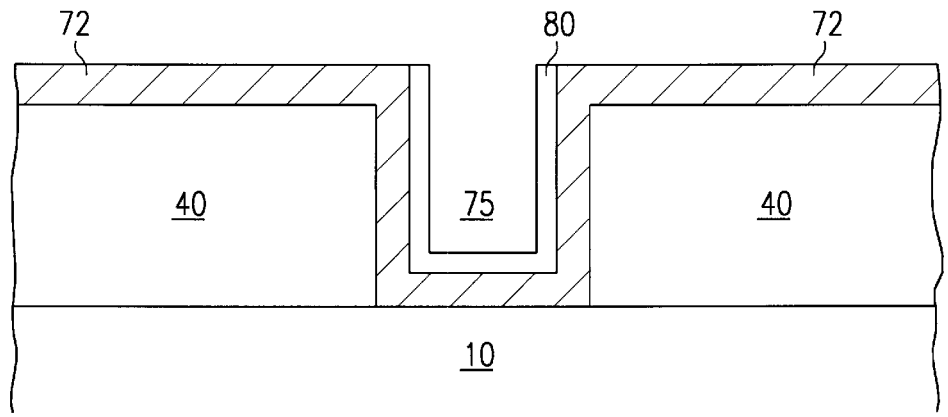

In FIG. 9A and B is shown an embodiment whereby the CMP inhibitor and moisture barrier consists of two layers, an insulating layer 72 such as PETEOS as described in FIG. 8 and a metallic layer 80. In this case 80 provides an improved moisture barrier for the Damascene trench 75 and may be such materials as tantalum, aluminum or titanium-nitride. If copper is to be electrodeposited for 74, this additional metallic moisture barrier is highly advantageous. However, metallic layer 80 must be polished to layer 72 to avoid undesired conduction and electrical leakage to other Damascene entrenched conductors. The results after CMP are sketched in FIG. 9B.

The invention is not to be construed as limited to the particular examples described here, as these are to be regarded as illustrative, rather than restrictive. For example, alternate embodiments can use high density layer of silicon dioxide (e.g. spin-on glass) in place of the aerogel 14 applied over the low density aerogel (which then is been aged and dried). A barrier layer (e.g., 0.05 microns of silicon nitride) is preferably applied over the aerogel 14 prior to the application of the high density layer of silicon dioxide. The plurality of insulating and conducting layers used for moisture barriers and CMP inhibitors is not restricted to the two used in the drawings as illustrative. The invention is intended to cover all process and structures which do not depart from the spirit and the scope of the invention.

I claim:

1. A method of forming a semiconductor structure, said method comprising the steps of:

forming a nanoporous dielectric layer over a substrate;

depositing a planarizing stopping material over the top surface of said nanoporous dielectric;

etching said stopping material and nanoporous dielectric layer to expose at least a portion of said substrate;

depositing a sidewall adjacent said nanoporous dielectric layer and said stopping layer;

depositing a first conductor metal;

planarizing said substrate.

2. The method of claim 1, wherein said planarizing is performed with Chemical Mechanical Polishing(CMP).

3. The method of claim 1, wherein said planarizing stopping material is a material which stops the planarizing method from reaching the nanoporous dielectric.

4. The method of claim 1, wherein said conductor metal consists of essentially aluminum, tungsten, copper or combinations thereof.

5. The method of claim 1, wherein said conductor deposition is by blanket sputtering.

6. The method of claim 5, wherein said sputtering is HDP sputtering.

7. The method of claim 5, wherein said sputtering is at a temperature of 300–600 degrees C.

8. The method of claim 5, wherein said sputtering is followed by metal reflow at a temperature of 300–600 degrees C. or extrusion at a pressure of 500–4000 psi.

9. The method of claim 1, wherein said depositing a sidewall comprises the steps of:

isotropically depositing a dielectric over the planarizing stopping material and nanoporous dielectric layer; and anisotropically patterning and etching the dielectric to remove said dielectric from said planarizing material and the surface of the substrate.

10. The method of claim 9, wherein said planarizing is performed with Chemical Mechanical Polishing(CMP).

11. The method of claim 9, wherein said planarizing stopping material is a material which stops the planarizing method from reaching the nanoporous dielectric.

12. The method of claim 9, wherein said conductor metal consists of essentially aluminum, tungsten, copper or combinations thereof.

13. The method of claim 9, wherein said conductor deposition is by blanket sputtering.

14. The method of claim 13, wherein said sputtering is HDP sputtering.

15. The method of claim 13, wherein said sputtering is at a temperature of 300–600 degrees C.

16. The method of claim 13, wherein said sputtering is followed by metal reflow at a temperature of 300–600 degrees C. or extrusion at a pressure of 500–4000 psi.

17. The method of claim 1, wherein said depositing a sidewall comprises depositing a conductive material over the planarizing stopping material and nanoporous dielectric layer.

18. The method of claim 17, wherein said planarizing is performed with Chemical Mechanical Polishing(CMP).

19. The method of claim 17, wherein said planarizing stopping material is a material which stops the planarizing method from reaching the nanoporous dielectric.

20. The method of claim 17, wherein said conductor metal consists of essentially aluminum, tungsten, copper or combinations thereof.

21. The method of claim 17, wherein said conductor deposition is by blanket sputtering.

22. The method of claim 21, wherein said sputtering is HDP sputtering.

23. The method of claim 21, wherein said sputtering is at a temperature of 300–600 degrees C.

24. The method of claim 21, wherein said sputtering is followed by metal reflow at a temperature of 300–600 degrees C. or extrusion at a pressure of 500–4000 psi.

25. The method according to claim 1 and further comprising forming a second conductor on the surface of said substrate wherein at least a portion of said second conductor is exposed when said substrate is exposed.

26. The method according to claim 1, wherein said stopping layer has a higher mechanical strength than the mechanical strength of said dielectric layer.

27. A method of forming a semiconductor structure, said method comprising the steps of:
forming a first dielectric layer on a substrate;
forming a stopping layer on said first dielectric layer;
forming a first opening in said first dielectric layer;
forming a second opening in said stopping layer, wherein said second opening has a common area with said first opening;
forming a sidewall within said first and second openings and adjacent said first and second openings.

28. The method according to claim 27, wherein said first dielectric layer is a nanoporous dielectric material.

29. The method according to claim 27, wherein said first dielectric layer has a dielectric constant of less than SiO2.

30. The method according to claim 27, wherein said sidewall is insulative.

31. The method according to claim 27, wherein said sidewall is conductive.

32. The method according to claim 27, wherein said stopping layer is a Chemical Mechanical Polishing stopping layer.

33. The method according to claim 27, and further comprising the step of forming a first conductor under said second opening.

34. The method according to claim 27, and further comprising the step of forming a first conductor on said substrate and under said second opening, such that said second opening exposes at least a portion of said conductor on said substrate.

35. The method according to claim 27, wherein said first and second openings are formed at the same time.

36. The method according to claim 27, wherein said first and second openings are formed at different times.

37. The method according to claim 33, and further comprising the step of forming a second conductor within said second opening and in electrical contact with said first conductor.

38. The method according to claim 34, and further comprising the step of forming a second conductor within said second opening and in electrical contact with said first conductor.

39. The method according to claim 27, wherein said first dielectric has a first dielectric constant and said sidewall has a second dielectric constant different from said first dielectric constant.

40. A method of forming a semiconductor structure comprising the steps of:
forming a first dielectric layer on a substrate, wherein said first dielectric layer has a top surface and a first density;
forming a first opening in said first dielectric layer thereby forming sidewalls of said dielectric layer wherein said sidewalls are adjacent said opening and;
treating said surface of and said sidewalls of said first dielectric layer to produce a dielectric of a second density, wherein said second density is greater than said first density.

41. The method according to claim 40, wherein said first dielectric layer is a nanoporous dielectric material.

42. The method according to claim 40, wherein said first dielectric layer has a dielectric constant of less than SiO2.

43. The method according to claim 40, wherein said treatment is application of PETEOS plugs.

44. The method according to claim 40, wherein said treatment is application of an annular ring of PETEOS.

45. The method according to claim 40, and further comprising the step of forming a first conductor under said opening.

46. The method according to claim 40, and further comprising the step of forming a first conductor on said substrate and under said opening, such that said opening exposes at least a portion of said conductor on said substrate.

47. The method according to claim 45, and further comprising the step of forming a second conductor within said second opening and in electrical contact with said first conductor.

48. The method according to claim 46, and further comprising the step of forming a second conductor within said second opening and in electrical contact with said first conductor.

49. A semiconductor structure, comprising:
a substrate;
a first dielectric layer on said substrate;
a stopping layer on said first dielectric layer;
a first opening in said first dielectric layer;
a second opening in said stopping layer, wherein said second opening has a common area with said first opening;
a sidewall within said first and second openings and adjacent said first and second openings.

50. The structure according to claim 49, wherein said first dielectric layer is a nanoporous dielectric material.

51. The structure according to claim 49, wherein said first dielectric layer has a dielectric constant of less than the dielectric constant of SiO2.

52. The structure according to claim 49, wherein said sidewall is insulative.

53. The structure according to claim 49, wherein said sidewall is conductive.

54. The structure according to claim 49, wherein said stopping layer is a Chemical Mechanical Polishing stopping layer.

55. The structure according to claim 49, and further comprising a first conductor under said second opening.

56. The structure according to claim 49, and further comprising a first conductor on said substrate and under said second opening, wherein said second opening exposes at least a portion of said conductor on said substrate.

57. The structure according to claim 55, and further comprising a second conductor within said second opening and in electrical contact with said first conductor.

58. The structure according to claim 56, and further comprising a second conductor within said second opening and in electrical contact with said first conductor.

59. The structure according to claim 49, wherein said first dielectric has a first dielectric constant and said sidewall has a second dielectric constant different from said first dielectric constant.

60. The method according to claim 27 wherein said stopping layer comprises SIO2.

61. The method according to claim 27 wherein said stopping layer comprises PETEOS.

62. The structure according to claim 49 wherein said stopping layer comprises SIO2.

63. The structure according to claim 49 wherein said stopping layer comprises PETEOS.

64. A semiconductor structure comprising:

a substrate;

a first dielectric layer on said substrate having a first mechanical strength;

a stopping layer on said first dielectric layer having a second mechanical strength, wherein said second mechanical strength is greater than said first mechanical strength;

a first opening in said first dielectric layer;

a second opening in said stopping layer, wherein said second opening has a common area with said first opening;

a first conductor within said second opening.

65. The structure according to claim 64 wherein said dielectric layer has a first density and said stopping layer has a second density and said second density is greater than said first density.

66. The structure according to claim 64 and further comprising a second conductor on said substrate and wherein said first conductor is in electrical contact with said second conductor.

67. The structure according to claim 64 wherein said stopping layer comprises SIO2.

68. The structure according to claim 64 wherein said stopping layer comprises PETEOS.

69. The structure according to claim 64 wherein said first dielectric layer is a nanoporous dielectric material.

70. The structure according to claim 64, wherein said first dielectric layer has a dielectric constant of less than the dielectric constant of SiO2.

71. The structure according to claim 64, wherein said stopping layer is a Chemical Mechanical Polishing stopping layer.

72. The structure according to claim 64 and further comprising a barrier layer on said stopping layer and within said second opening.

73. The structure according to claim 72, wherein said first conductor is on said barrier layer and within said opening.

74. A semiconductor structure comprising:

a substrate;

a first dielectric layer on said substrate;

a stopping layer on said first dielectric layer, wherein said stopping layer is part of the finished semiconductor structure;

a first opening in said first dielectric layer;

a second opening in said stopping layer, wherein said second opening has a common area with said first opening;

a first conductor within said second opening.

75. The structure according to claim 74 wherein said dielectric layer has a first density and said stopping layer has a second density and said second density is greater than said first density.

76. The structure according to claim 74 and further comprising a second conductor on said substrate and wherein said first conductor is in electrical contact with said second conductor.

77. The structure according to claim 74 wherein said stopping layer comprises SIO2.

78. The structure according to claim 74 wherein said stopping layer comprises PETEOS.

79. The structure according to claim 74, wherein said first dielectric layer is a nanoporous dielectric material.

80. The structure according to claim 74, wherein said first dielectric layer has a dielectric constant of less than the dielectric constant of SiO2.

81. The structure according to claim 74, wherein said stopping layer is a Chemical Mechanical Polishing stopping layer.

82. The structure according to claim 74 and further comprising a barrier layer on said stopping layer and within said second opening.

83. The structure according to claim 82, wherein said first conductor is on said barrier layer and within said opening.

84. A method of forming a semiconductor structure comprising the steps of:

forming a first dielectric layer on said substrate having a first mechanical strength;

forming a stopping layer on said first dielectric layer having a second mechanical strength, wherein said second mechanical strength is greater than said first mechanical strength;

forming a first opening in said first dielectric layer;

forming a second opening in said stopping layer, wherein said second opening has a common area with said first opening;

forming a first conductor within said second opening.

85. The method according to claim 84 wherein said dielectric layer has a first density and said stopping layer has a second density and said second density is greater than said first density.

86. The method according to claim 84 and further comprising the step of forming a second conductor on said substrate and wherein said first conductor is in electrical contact with said second conductor.

87. The method according to claim 84 wherein said stopping layer comprises SIO2.

88. The method according to claim 84 wherein said stopping layer comprises PETEOS.

89. The method according to claim 84, wherein said first dielectric layer is a nanoporous dielectric material.

90. The method according to claim 84, wherein said first dielectric layer has a dielectric constant of less than the dielectric constant of SiO2.

91. The method according to claim 84, wherein said stopping layer is a Chemical Mechanical Polishing stopping layer.

92. The method according to claim 84 and further comprising forming a barrier layer on said stopping layer and within said second opening.

93. The method according to claim 92, wherein said first conductor is on said barrier layer and within said opening.

94. The method according to claim 84 wherein said step of forming said first conductor comprises:

forming a barrier layer on said stopping layer and within said second opening and;

forming a conductor on said barrier layer.

95. The method according to claim 94 and further comprising the step of planarizing said structure wherein said conductor is removed from said stopping layer and remains within said second opening.

96. The method according to claim 84 wherein said step of forming a first conductor comprises:

forming a conductor on said stopping layer and within said second opening; and, planarizing said structure wherein said conductor is removed from said stopping layer and remains within said second opening.

97. The method according to claim 37 wherein the step of forming a second conductor comprises the steps of:

forming a second conductor on said stopping layer and within said second opening; and further comprising the step of planarizing said structure wherein said second conductor is removed from said stopping layer and remains within said second opening.

98. The method according to claim 38 wherein the step of forming a second conductor comprises the steps of;

forming a second conductor on said stopping layer and within said second opening and;

further comprising the step of planarizing said structure wherein said second conductor is removed from said stopping layer and remains within said second opening.

99. The method according to claim 57 wherein the step of forming a second conductor comprises the steps of:

forming a second conductor on said stopping layer and within said second opening and;

further comprising the step of planarizing said structure wherein said second conductor is removed from said stopping layer and remains within said second opening.

100. The method according to claim 58 wherein the step of forming a second conductor comprises the steps of;

forming a second conductor on said stopping layer and within said second opening and;

further comprising the step of planarizing said structure wherein said second conductor is removed from said stopping layer and remains within said second opening.

* * * * *